United States Patent [19]
Khurana et al.

[11] Patent Number: 5,956,608
[45] Date of Patent: Sep. 21, 1999

[54] MODULATING SURFACE MORPHOLOGY OF BARRIER LAYERS

[75] Inventors: Nitin Khurana, Santa Clara; Ted Guo, Palo Alto, both of Calif.

[73] Assignee: Applied Materials, Inc., Santa Clara, Calif.

[21] Appl. No.: 08/667,842

[22] Filed: Jun. 20, 1996

[51] Int. Cl.$^6$ .......................... H01L 21/28; H01L 21/306
[52] U.S. Cl. .......................... 438/627; 438/640; 438/653; 438/714; 438/906
[58] Field of Search .................................. 438/677, 798, 438/665, 622, 627, 637, 638, 640, 643, 653, 713, 714, 906, 632

[56] References Cited

U.S. PATENT DOCUMENTS

| | | | |
|---|---|---|---|
| 5,296,404 | 3/1994 | Akahori et al. | 438/668 |
| 5,320,981 | 6/1994 | Blalock | 438/640 |
| 5,460,689 | 10/1995 | Raaijmakers et al. | 156/643.1 |
| 5,627,102 | 5/1997 | Shinriki et al. | 438/648 |
| 5,658,829 | 8/1997 | Mathews et al. | 438/656 |

OTHER PUBLICATIONS

Park, et al., "Fabrication of 256Mbit Dram With a Fully Planarized Double Level Interconnection," VMIC Conference, pp. 45–51 (Jun. 27–29, 1995).

*Primary Examiner*—T. N. Quach
*Attorney, Agent, or Firm*—Fish & Richardson

[57] ABSTRACT

A process for fabricating electronic devices which includes the steps of providing a structure that includes a substrate with an overlying dielectric layer having one or more contact holes and/or vias formed therein; depositing a barrier layer over the structure so that the barrier layer penetrates into the contact holes and/or vias; plasma etching the deposited barrier layer so as to modify its surface morphology; and after modifying the surface morphology of the deposited barrier layer, depositing a metalization layer over the barrier layer. A two-step preclean to facet upper corners of the holes and/or vias and to clean bottoms of the holes and/or vias is performed prior to the deposition of the barrier layer.

13 Claims, 2 Drawing Sheets

MODULATING SURFACE MORPHOLOGY OF BARRIER LAYERS

BACKGROUND OF THE INVENTION

The invention relates generally to a method for improving the surface characteristics of barrier layers that are used in semiconductor processing.

Submicron, straight walled contacts with high aspect ratios (i.e., ratio of depth to width >2) may be metallized with the use of collimated Ti/TiN PVD (Physical Vapor Deposition) technologies, followed by CVD-W (Chemical Vapor Deposition with tungsten), PVD Al/reflow or cold/hot PVD Al to completely fill the contacts. However, at these high aspect ratios, obtaining effective flow of the deposited material into the contact holes can present some difficulties. In the past, effective reflow or diffusion of the deposited metals into the holes was achieved by using higher process temperatures and/or longer process times. It is desirable, however, to find other ways of achieving these objectives without having to use higher process temperatures or longer process times. The invention addresses this need.

SUMMARY OF THE INVENTION

In general, in one aspect, the invention is a process for use in fabricating electronic devices and that includes the steps of: providing a structure that includes a substrate with an overlying dielectric layer having one or more contact holes and/or vias formed therein; depositing a barrier layer over the structure so that the barrier layer penetrates into the contact holes and/or vias; plasma etching the deposited barrier layer so as to modify its surface morphology; and after modifying the surface morphology of the deposited barrier layer, depositing a metalization layer over the barrier layer.

Preferred embodiments include the following features. The barrier layer is made of TiN or Ti/TiN and the metalization layer is aluminum, copper, or tungsten, just to name a few examples. The plasma etching step is performed using an RF generated plasma. The process further includes the step of using a plasma etch to facet upper corners of the holes/vias, prior to depositing the barrier layer. The process also includes the steps of: prior to depositing the barrier layer, plasma etching the structure in a first atmosphere characterized by a first pressure; and plasma etching the structure in a second atmosphere characterized by a second pressure, wherein the first pressure is different from (e.g. higher than) than the second pressure. Also, the first pressure is selected to facilitate facetting of upper corners of the holes/vias and the second pressure is selected to facilitate cleaning bottoms of the holes/vias. More specifically, the first pressure is in a range of about 10 to 100 mTorr and the second pressure is in a range of about 0.2 to 4.0 mTorr.

In part the invention involved recognizing the importance of and the ability to improve surface morphology of barrier metal layers and recognizing that this advantageously affects integration of various process steps for both tungsten CVD and Al and/or Cu planarization. Thus, one very important aspect of the invention is simply using an RF etch step to smooth out the surface of the barrier layer, typically Ti or TiN, prior to depositing metal layer thereover, a step which we refer to below as a surface morphology modifying step.

The surface morphology modifying step has the effect of enhancing reflow of the over-deposited metal and thereby reducing the temperatures or the process times that are required to achieve a desired level of planarization by reflow. That is, it enables the process engineer to reduce the overall thermal budget that is required for the fabricating electronic devices on a wafer. In the case of Al deposited on a Ti/TiN barrier layer for example, the Al planarization can be performed at about 350–400° C.

Even if the process is not adjusted to take advantage of the lower reflow temperatures, the overall device yields will be better on wafers that are fabricated using the invention. This is because the process window (i.e., the range of acceptable process conditions) is made larger and thus the fabrication procedure is more forgiving of the variations in process conditions that inevitably occur.

Other advantages and features will become apparent from the following description of the preferred embodiment and from the claims.

DESCRIPTION OF THE PREFERRED EMBODIMENTS

Figure 1:
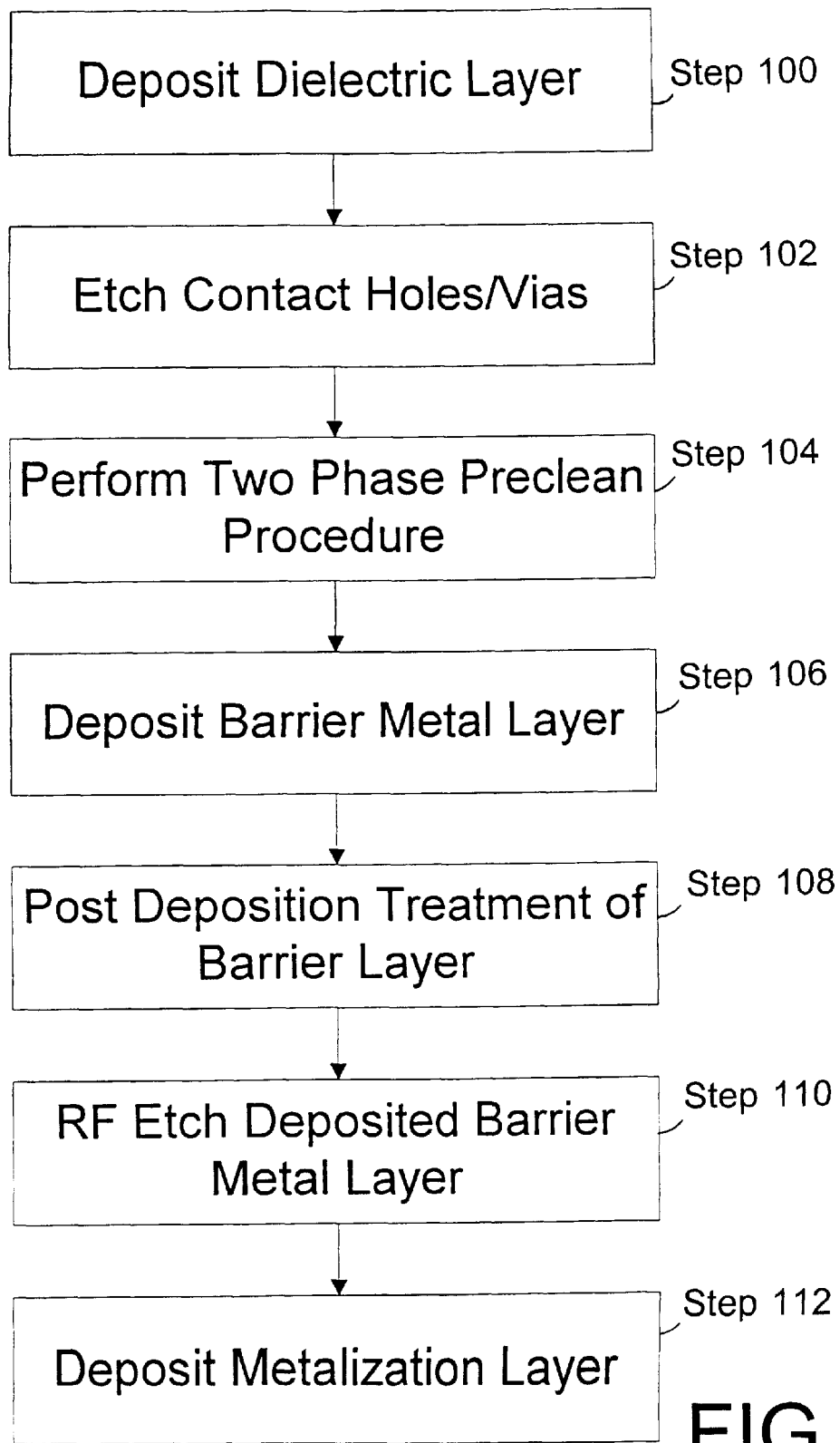
FIG. 1 is a flow chart of the process steps of the invention.

With the aid of FIG. 1, we first present an overview of a process which embodies the invention. Afterwards, we then provide further details about individual steps in the process.

Overview of the Process:

Referring to FIG. 1, it is assumed that we are starting with a substrate (e.g. semiconductor wafer) which may have already undergone some processing steps during which device structures and/or metalizations were formed in or on the substrate. In the described embodiment, the substrate is a silicon wafer.

A dielectric layer (e.g. $SiO_2$ or $Si_3N_4$) is first formed over the surface of the substrate to protect the underlying device and interconnect structures (step 100). This can be done using conventional semiconductor processing techniques that are well known to persons skilled in the art. For example, in the case of a silicon dioxide layer, the dielectric layer can be formed by chemical vapor deposition using TEOS, BPSG, or SOG, just to name a few possibilities.

After depositing the dielectric layer, contact holes and/or vias are etched into the dielectric layer at predetermined locations so that electrical contact can be made with the underlying devices and/or metalizations (step 102). Vias are like holes except that the underlying layer is metal instead of Si or some other semiconductor material in which the electrical devices are fabricated. Again, the etching of the holes/vias can be performed using any one of a variety of techniques the details of which are well known to persons of ordinary skill in the art. For example, this can be done using a wet chemical etch or a plasma etch, just to name two very different alternatives.

After the contact holes/vias are formed in the dielectric layer, the substrate is placed in a plasma etch chamber and an RF plasma is used to perform a preclean procedure (step 104). In the described embodiment, the plasma etch chamber is the Preclean II Chamber manufactured by Applied Materials, Inc., the assignee of the present invention. Although it should be understood that many other commercially available plasma etch chambers would be equally acceptable.

The preclean procedure has two phases, namely, a high pressure phase and a low pressure phase. The purpose of the high pressure phase is taper or facet the upper edge of the contact holes/vias so that an overhang does not form at the location during a subsequent deposition. Straight contact side walls and sharp upper corners tend to cause a re-entrant structure or overhang even in a collimated Ti/TiN deposition and especially in the case of high aspect ratio holes. The overhang shields the lower portion of the wall from material during subsequent depositions, e.g. the deposition of a barrier layer. Thus, the side wall will not be completely covered by a wetting layer and the effective flow of metal (e.g. Al) into the contact during the metalization step will be hampered.

The purposes of the low pressure phase are: (1) to clean the bottoms of the contact holes/vias so as to improve the electrical contact that will be achieved; (2) to clean up the sidewalls of the hole to prepare them for the deposition of the wetting layer and the barrier layer; and (3) to clean the top of the dielectric layer.

The ordering of the two phases is optional, though it may be preferable to perform the high pressure phase first followed by the low pressure phase. In addition, either one or both of the phases can be split. For example, if a low pressure phase is performed first, followed by a high pressure phase, it might be useful to return to the low pressure phase to clean up the bottom of the holes from any material that might have deposited there during the high pressure phase.

After the preclean procedure, a barrier metal is deposited onto the surface of the substrate and in the holes/vias (step 106). This barrier metal deposition process can be performed using conventional well known techniques. For example, in the described embodiment a PVD chamber is used to deposit a Ti/TiN barrier layer. In the Ti/TiN deposition, the Ti layer, which is typically the first deposited layer, is a wetting layer that serves to improve contact between the actual barrier layer and the dielectric. The subsequent TiN layer is the actual barrier, i.e., it prevents diffusion of the later deposited metal down into the underlying device where it may cause spiking shorts.

After depositing the barrier, it may be desirable to perform a post deposition treatment of the barrier layer to improve its stability and strength (step 108). For example, it is known to anneal or treat the deposited material in some manner. The anneal may be performed in an oxygen atmosphere in which case the low density TiN layer will be stuffed with oxygen to form $TiO_xN_y$ which produces a better quality barrier layer.

Following the post deposition treatment, the substrate is transferred to a plasma etch chamber and an RF etch is performed on it (step 110). This RF etch, which is an important part of the process, has several purposes. First, it cleans the surface of the barrier layer and removes any adsorbed gases and other possible contaminants that have settled there. Secondly, and equally important, it alters the surface morphology of the barrier layer by reducing its roughness and making it smoother. Both of these aspects will facilitate the flowing or diffusion of the contact metalization during a subsequent metal deposition phase. That is, by eliminating the contaminants and by making the surface smoother, the deposited metal will tend to flow or diffuse more readily thereby leading to more effective filling of the contact holes/vias and more effective planarization of the deposited metal.

Finally, a metalization layer is deposited onto the surface of the substrate (step 112). Again, a conventional technique may be used to deposit the metal. In the described embodiment, the deposited metal is aluminum. It may be either deposited at a cold temperature followed by a reflow at a higher temperature. Or it could be deposited cold followed by a high temperature deposition. Moreover, it can be deposited using PVD or it can be formed by using CVD or other known deposition techniques or even a combination of PVD and other known techniques. In other words, the details of the metalization process are not of central importance and will depend upon the requirements of the particular fabrication process that is being performed.

Since the preclean and the morphology modifying steps are of central importance in the above-described process, we will elaborate on those parts of the process first. Afterwards, we will discuss further details of the other steps.

Figure 2:
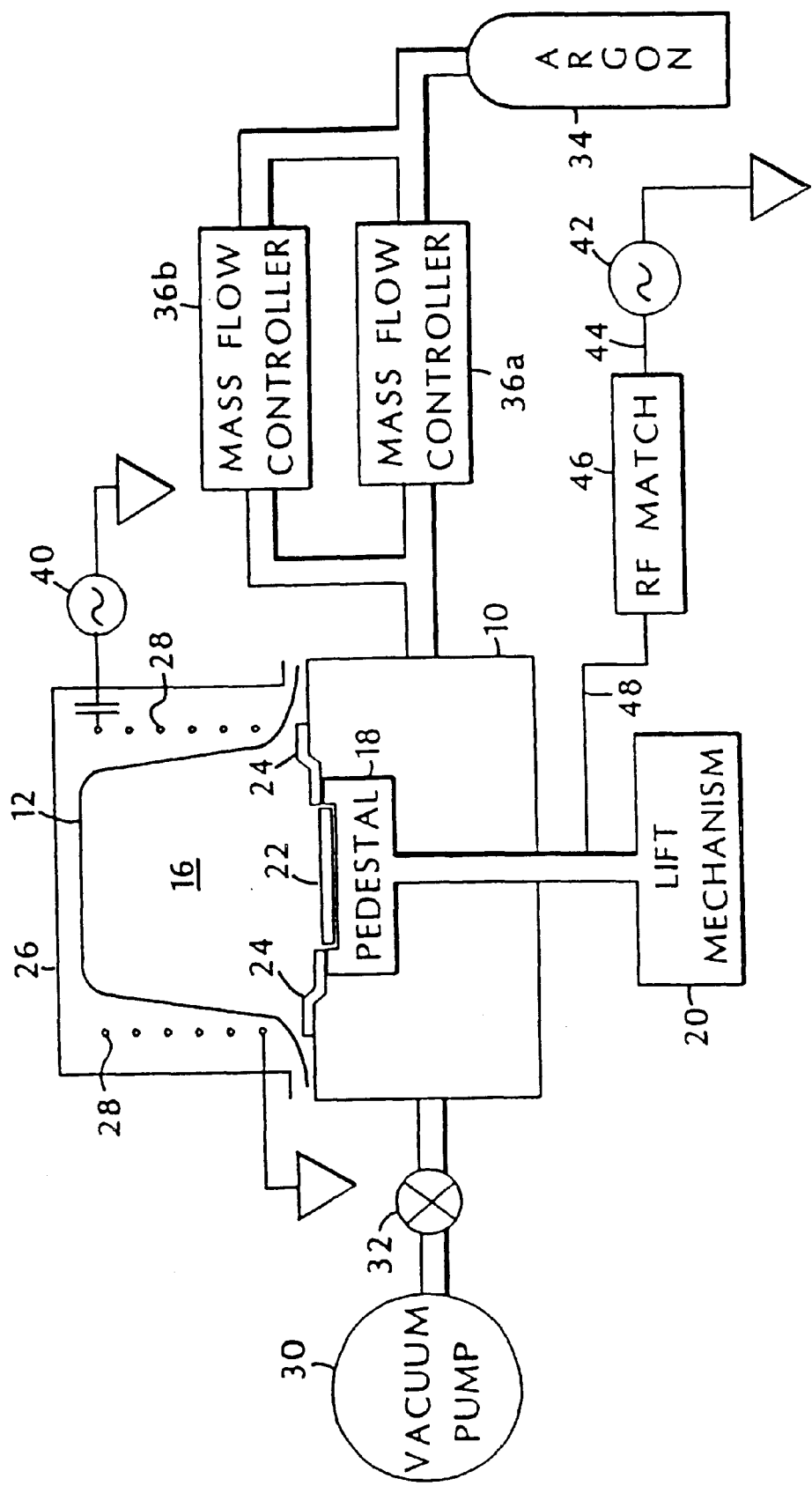
FIG. 2 is a schematic representation of an etch chamber such as can be used to carry of the preclean and morphology modifying steps.

The Preclean Phase:

In the described embodiment, the preclean procedures are performed in a dual frequency RF etch chamber which has the general configuration shown in FIG. 2.

The preclean system includes a chamber body 10 and a bell jar 12 (sometimes referred to as a dome). Bell jar 12 is mounted onto chamber body 10 to form a sealed sputtering cavity 16 for holding a vacuum and in which a plasma may be generated. Bell jar 12 is made of quartz which is a process consumable material and an internal surface is bead-blasted to promote particle adherence.

Within cavity 16, there is a pedestal 18 which can be raised and lowered by a lift mechanism 20 located beneath the chamber body. A wafer 22 which is to be etched rests on top of pedestal 18. When the wafer/pedestal is raised into position for sputter etching, the outer perimeter of wafer 22 comes into contact with an annular shield 24 that is affixed to chamber body 10. Shield 22, which is made of process consumable aluminum, serves to contain the plasma above the pedestal inside the bell jar and prevent sputtering of the chamber body. It also acts as a particle catcher and traps oxide particles that are being etched from wafer 22.

Above bell jar 12 there is an RF resonator located within a grounded metal protective cover 26. The RF resonator includes a copper coil 28 wound around the outside of bell jar 12. The metal protective cover outside the resonator protects the plasma etching process from any magnetic fields that may be generated by adjacent plasma PVD chambers and it tends to improve process uniformity. RF energy from coil 28 penetrates through bell jar 12 to strike a plasma in cavity 16.

A vacuum pump 30, which is connected to chamber 10 through a line containing a throttle valve 32, evacuates the chamber in preparation for a plasma sputtering preclean. A bottle 34 of pressurized argon gas supplies argon to the chamber through a mass flow controller 36a. The desired operating pressures are obtained by appropriately setting the flow rate of argon into the chamber and the throttle valve to the vacuum pump.

Dual RF power supplies or generators 40 and 42 independently supply power to the cavity. RF generator 42 supplies capacitively coupled high frequency power (e.g. 13.56 MHz) to pedestal 18 (i.e., wafer bias power). It is a user-adjustable, all solid-state, wafer-cooled power source (e.g. Model CPS-1000/1356 by Comdel Inc.) that can provide 1 kW into a dummy load and is specifically tuned to prevent drifting. RF generator 42 is connected through an RF cable 44 to an RF match network 46 which in turn is connected to pedestal 18 through another cable 48. RF match network 46 adjusts the pedestal impedance to match the impedance of the RF cable (50 Ω) from RF generator 42.

RF generator 40 supplies low frequency power (e.g. 400 KHz) for the inductively coupled resonator (i.e., plasma power). RF generator 40 is an all solid-state, air-cooled plasma power source (e.g. Model LF-10 by RF Power Products Inc.) that provides 1 kW self tuned (350–450 kHz)

power using an internal computer. A capacitor is added in series with the coil to match the impedance as closely as possible to 50 ohms. No matching network is needed because the lower frequency enables the generator to self-tune by slightly varying the RF frequency.

Coil 28 is powered by low-frequency power at about 400 kHz to strike a plasma in cavity 10. Increasing power to coil 20 increases the density of the plasma inside bell jar 12.

The important parameters in any preclean process are the etch rate and the uniformity of the etch. In general, these are controlled in well known ways by RF power applied, time, chamber pressure, and wafer position in the chamber, and the wafer bias or DC bias that is used during etching. In this particular preclean system, the etch rate and the DC offset voltage are controlled independently. This is done by using RF supply 40 to produce a plasma within bell jar 12 and by using wafer bias supply 22 to generate a second plasma above the wafer acting as an independent ion source.

The two stage precleaning technique provides a way by which one can facet the entry to the contact hole without removing substantial material from the bottom of the contact holes. In general, the wafer with straight walled contact holes is first subjected to ion bombardment under high pressure in an Ar plasma. The high pressure Ar sputter etch is then followed in-situ by a low pressure sputter etch to create a clean surface in the bottom of the contact to ensure good electrical characteristics.

In general, the low pressure phase is done in an argon gas atmosphere at a pressure in the range of about 0.2–4 mTorr. And the high pressure phase is done at a pressure in the range of about 10–100 mTorr. The DC bias is typically in the range of about 50–600 volts. This produces an etch rate in the range of about 100–1000 Å/min. In one embodiment, both phases of the preclean procedure are done with a bias on the wafer of about 225–250 volts, which yields an upper surface etch rate of about 450–500 Å/min.

During the low pressure Ar sputter etch, ion bombardment is perpendicular to the wafer surface, and hence the amount of material removed from the bottom area's of the contact can be nearly equal (>50%) to that removed from the top corners. At the higher pressures of the high pressure phase, the amount of material removed from the bottom areas will be significantly less than that removed from the top corner of the contact holes or even the field oxide layer. Thus, a significant amount of facetting can be introduced on the top corner regions (e.g. 1000–2000 Å) while removing less than 100 Å from the bottom of the contact.

Further details of the high pressure and low pressure process are presented in U.S. patent Ser. No. 8/202,477 entitled "High Pressure Plasma Treatment Method and Apparatus," incorporated herein by reference.

The Morphology Modifying Step:

In the described embodiment, a chamber having the configuration shown in FIG. 2 is also used to perform the surface morphology modifying step.

A typical wafer bias might be −250 volts to yield an equivalent oxide etch rate of about 500 Å/min (i.e., it would etch oxide at that rate). In general, the wafer bias can be in the range of about −50 to −1000 volts. The bias voltage determines the energy of the bombarding Ar ions and voltages having a magnitude above 50 volts results in sputtering of the barrier metal material. Typically, an etch rate that is on the order of about 100–750 Å/min oxide equivalent is desirable. At such etch rates, the duration of the etch process is from 5–30 seconds. Also, since it is desirable to smooth all of the sidewall as well as the top of the barrier layer, the argon pressure during etching should be kept low enough to permit effective etching deep into the contact hole/via.

Note that these etch rates can also remove a reasonable amount of material from the bottom as well. It is desirable, however, to avoid removing too much from the bottom of the contact otherwise it will detrimentally affect the quality of the barrier layer down there.

As a practical matter the RF etch process (i.e., the surface morphology modifying step) is applicable to barrier metal layers deposited in any way. The process is particularly suited to modifying the surface morphology of deposited Ti/TiN layers, which are characterized by a rough surface that acts to inhibit reflow of metal (e.g. Al or Cu) into the contact area. In addition, it is applicable to other barrier materials such as, for example, TiW.

In addition, though we have described using a dual frequency etch chamber, it should be understood that any etch chamber can be used which is capable of bombarding the surface of the deposited barrier metal layer with energetic atoms (e.g. argon ions) so as to change the morphology of the surface, i.e., to make the surface smoother. In general, the ion bombardment energy is such as to actually dislodge atoms from the surface of the barrier layer to thereby dislodge gases and other contaminants and produce a smoother surface.

Ti/TiN Deposition:

The Ti/TiN process may be completely conventional. It is not particularly important how the barrier/glue layer is laid down. In the described embodiment, it is done in an inductively coupled high density PVD chamber using a Ti target. In such a chamber, the deposition may be performed using either an unbiased wafer or a biased wafer.

If a noncoherent deposition chamber is used (i.e., one without a collimator), typical power levels for the deposition might fall between 6.5 to 10 kW at a chamber pressure between about 3.5 to 12 Torr. This generally will yield a deposition rate of about 1000–1500 Å/min. A low pressure (e.g. 2–4 mTorr) is typically used with an argon atmosphere to deposit the Ti layer. And higher pressures are typically used with an Ar and N atmosphere to deposit a TiN layer onto the previously deposited Ti layer.

In a coherent deposition chamber (i.e., one which uses a collimator), the power levels are typically higher than what are used in a chamber that does not have a collimator. For example, power levels might typically be in the range of about 12–24 kW with chamber pressures in a range of about 1.5–12 mTorr.

It is desirable to perform the wafer transfers, particularly those which occur after the morphology modifying step, under vacuum conditions, which can easily be done using the cluster tools that are currently commercially available.

Note that the invention can be used to improve the reflow of any metal that might be deposited onto the barrier layer, including for example Al and Cu. It can also be used with refractory metals such as tungsten to improve the quality of the contact and nucleation. Furthermore, the morphology modifying step can be used prior to the deposition of the glue or wetting layer (e.g. the Ti layer) whether or not a barrier layer is used. In that case, it would be essentially a morphology modifying step and would be used to improve the contact between the subsequently deposited interconnect layer (e.g. Al or Cu) and the dielectric.

Other embodiments are within the following claims.

What is claimed is:

1. A process for fabricating electronic devices, said process comprising the steps of:

providing a structure that includes a substrate with an overlying dielectric layer having one or more contact holes and/or vias formed therein;

performing a two-step preclean to facet upper corners of the holes and/or vias and to clean bottoms of the holes and/or vias;

then, depositing a barrier layer over the structure so that the barrier layer penetrates into the contact holes and/or vias;

plasma etching the deposited barrier layer so as to modify its surface morphology; and after modifying the surface morphology of the deposited barrier layer, depositing a metalization layer over the barrier layer.

2. The process of claim 1 wherein the barrier layer comprises TiN.

3. The process of claim 1 wherein the barrier layer comprises Ti/TiN.

4. The process of claim 1 wherein the plasma etching step is performed using an RF generated plasma.

5. The process of claim 1 wherein the metalization layer comprises aluminum.

6. The process of claim 1 wherein the metalization layer comprises tungsten.

7. The process of claim 1 wherein the metalization layer comprises copper.

8. The process of claim 1, wherein the performing a two-step preclean comprises:

plasma etching the structure in a first atmosphere characterized by a first pressure; and plasma etching the structure in a second atmosphere characterized by a second pressure, wherein the first pressure is different than the second pressure.

9. The process of claim 8 wherein the first pressure is higher than the second pressure.

10. The process of claim 9 wherein the first pressure is selected to facilitate facetting of upper corners of the holes/vias.

11. The process of claim 10 wherein the second pressure is selected to facilitate cleaning bottoms of the holes/vias.

12. The process of claim 9 wherein the first pressure is in a range of about 10 to 100 mTorr.

13. The process of claim 9 wherein the second pressure is in a range of about 0.2 to 4.0 mTorr.

* * * * *